US012707938B2

(12) United States Patent
Rathi et al.

(10) Patent No.: US 12,707,938 B2
(45) Date of Patent: Aug. 11, 2026

(54) SUSCEPTOR FOR SEMICONDUCTOR SUBSTRATE PROCESSING

(71) Applicant: ASM IP Holding, B.V., Almere (NL)

(72) Inventors: Saket Rathi, Tempe, AZ (US); Shiva K.T. Rajavelu Muralidhar, Tempe, AZ (US); Siyao Luan, Phoenix, AZ (US); Alexandros Demos, Scottsdale, AZ (US); Xing Lin, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 559 days.

(21) Appl. No.: 18/448,638

(22) Filed: Aug. 11, 2023

(65) Prior Publication Data

US 2023/0386889 A1 Nov. 30, 2023

Related U.S. Application Data

(62) Division of application No. 17/075,504, filed on Oct. 20, 2020, now Pat. No. 11,764,101.

(Continued)

(51) Int. Cl.

*H10P 72/76* (2026.01)
*H10P 34/42* (2026.01)

(Continued)

(52) U.S. Cl.

CPC ........ *H10P 72/7614* (2026.01); *H10P 34/422* (2026.01); *H10P 72/0436* (2026.01);

(Continued)

(58) Field of Classification Search

CPC ......... H01L 21/67115; H01L 21/67248; H01L 21/67253; H01L 21/68; H01L 21/68735;

(Continued)

(56) References Cited

U.S. PATENT DOCUMENTS 3,407,783 A 10/1968 Capita
3,549,847 A 12/1970 Clark et al.

(Continued)

FOREIGN PATENT DOCUMENTS

CN 102308362 A 1/2012
CN 103733327 A 4/2014

(Continued)

OTHER PUBLICATIONS

"Shaping the Future in Semiconductor Processing." Advertisement for Morton International, Inc., Ceramic Solutions. vol. 73, No. 7, Jul. 1994: advertisements (circa 1993).

*Primary Examiner* — Mary A Wilczewski
(74) *Attorney, Agent, or Firm* — Banner & Witcoff, Ltd.

(57) ABSTRACT

A susceptor for semiconductor substrate processing is disclosed herein. In some embodiments, the susceptor may comprise an inner susceptor portion and an outer susceptor portion. The susceptor portions may self-align via complementary features, such as tabs on the outer susceptor and recesses on the inner susceptor portion. The inner susceptor portion may contain several contact pads with which to support a wafer during semiconductor processing. In some embodiments, the contact pads are hemispherical to reduce contact area with the wafer, thereby reducing risk of backside damage. The inner susceptor portion may contain a cavity with which to receive a thermocouple. In some embodiments, the diameter of the cavity is greater than the diameter of the thermocouple such that the thermocouple does not contact the walls of the cavity during processing, thereby providing highly accurate temperature measurements.

8 Claims, 11 Drawing Sheets

Related U.S. Application Data

(60) Provisional application No. 62/925,705, filed on Oct. 24, 2019.

(51) Int. Cl.
*H10P 72/00* (2026.01)
*H10P 95/90* (2026.01)

(52) U.S. Cl.
CPC ...... *H10P 72/0604* (2026.01); *H10P 72/7611* (2026.01); *H10P 95/90* (2026.01); *H10P 72/0602* (2026.01)

(58) Field of Classification Search
CPC ........... H01L 21/6875; H01L 21/68785; C23C 16/4583; H10P 72/7611; H10P 72/7614; H10P 72/0602; H10P 72/0604; H10P 72/7624
See application file for complete search history.

(56) References Cited

U.S. PATENT DOCUMENTS 3,641,974 A 2/1972 Yamada et al.
3,796,182 A 3/1974 Rosler
4,499,354 A 2/1985 Hill et al.
4,522,149 A 6/1985 Garbis et al.
4,560,420 A 12/1985 Lord
4,710,428 A 12/1987 Tamamizu et al.
4,821,674 A 4/1989 deBoer et al.
4,958,061 A 9/1990 Wakabayashi et al.
4,978,567 A 12/1990 Miller
4,986,215 A 1/1991 Yamada et al.
4,990,374 A 2/1991 Keeley et al.
5,033,407 A 7/1991 Mizuno et al.
5,044,943 A 9/1991 Bowman et al.
5,071,670 A 12/1991 Kelly
5,074,017 A 12/1991 Toya et al.
5,098,198 A 3/1992 Nulman et al.
5,108,792 A 4/1992 Anderson et al.
5,119,540 A 6/1992 Kong et al.
5,119,541 A 6/1992 Ohmi et al.
5,121,531 A 6/1992 Severns et al.
5,156,820 A 10/1992 Wong et al.
5,188,501 A 2/1993 Tomita et al.
5,199,483 A 4/1993 Bahng
5,200,157 A 4/1993 Toya et al.
5,242,501 A 9/1993 McDiarmid
5,292,554 A 3/1994 Sinha et al.
5,298,465 A 3/1994 Levy
5,304,248 A 4/1994 Cheng et al.
5,306,699 A 4/1994 Eddy
5,308,645 A 5/1994 Zachman et al.
5,332,442 A 7/1994 Kubodera et al.
5,343,938 A 9/1994 Schmidt
5,354,715 A 10/1994 Wang et al.
5,356,486 A 10/1994 Sugarman et al.
5,370,739 A 12/1994 Foster et al.
5,383,971 A 1/1995 Selbrede
5,393,349 A 2/1995 Ohkase
5,403,401 A 4/1995 Haafkens et al.
5,421,893 A 6/1995 Perlov
5,427,620 A 6/1995 deBoer et al.
5,444,217 A 8/1995 Moore et al.
5,455,069 A 10/1995 Lee
5,456,757 A 10/1995 Aruga et al.
5,461,214 A 10/1995 Peck et al.
5,467,220 A 11/1995 Xu
5,492,566 A 2/1996 Sumnitsch
5,514,439 A 5/1996 Sibley
5,516,367 A 5/1996 Lei et al.
5,527,393 A 6/1996 Sato et al.
5,549,756 A 8/1996 Sorensen et al.
5,551,985 A 9/1996 Brors et al.
5,558,717 A 9/1996 Zhao et al.
5,584,936 A 12/1996 Pickering et al.
5,588,827 A 12/1996 Muka
5,620,525 A 4/1997 van de Ven et al.
5,645,646 A 7/1997 Beinglass et al.
5,656,093 A 8/1997 Burkhart et al.
5,683,518 A 11/1997 Moore et al.
5,690,742 A 11/1997 Ogata et al.
5,700,725 A 12/1997 Hower et al.
5,738,165 A 4/1998 Imai
5,761,023 A 6/1998 Lue et al.
5,800,622 A 9/1998 Takemi et al.
5,803,977 A 9/1998 Tepman et al.
5,834,737 A 11/1998 Hirose et al.
D404,370 S 1/1999 Kimura
5,895,530 A 4/1999 Shrotriya et al.
5,938,850 A 8/1999 Arami et al.
5,960,159 A 9/1999 Ikeda et al.
6,001,183 A 12/1999 Gurary et al.
6,020,212 A 2/2000 Mathis
6,068,441 A 5/2000 Raaijmakers et al.
6,077,357 A 6/2000 Rossman et al.
6,086,680 A 7/2000 Foster et al.
6,090,212 A 7/2000 Mahawili
6,093,252 A 7/2000 Wengert et al.
6,100,505 A 8/2000 Pike
6,167,834 B1 1/2001 Wang et al.
6,168,668 B1 1/2001 Yudovsky
6,280,183 B1 8/2001 Mayur et al.
6,293,749 B1 9/2001 Raaijmakers et al.
6,325,858 B1 12/2001 Wengert et al.
6,331,023 B1 12/2001 Goodwin et al.
6,343,183 B1 1/2002 Halpin et al.
6,355,909 B1 3/2002 Griffiths et al.
6,394,797 B1 5/2002 Sugaya et al.
6,402,850 B1 6/2002 Beinglass et al.
6,462,411 B1 10/2002 Watanabe et al.
6,464,790 B1 10/2002 Sherstinsky et al.
6,551,404 B2 4/2003 Snijders et al.
6,554,906 B1 4/2003 Kuibira et al.
6,561,798 B2 5/2003 Kuznetsov et al.
6,608,287 B2 8/2003 Halpin et al.
6,634,882 B2 10/2003 Goodman
6,709,267 B1 3/2004 Hawkins
D496,008 S 9/2004 Takahashi et al.
6,893,507 B2 5/2005 Goodman et al.
7,033,445 B2 4/2006 Keeton
7,048,488 B1 5/2006 Kuznetsov et al.
D525,127 S 7/2006 Cogley et al.
D600,223 S 9/2009 Aggarwal et al.
7,601,224 B2 10/2009 Foree
7,602,224 B2 10/2009 Lee
7,648,579 B2 1/2010 Goodman
7,722,441 B2 5/2010 Goela et al.
7,740,703 B2 6/2010 Hasegawa et al.
7,758,340 B2 7/2010 Akimoto et al.
8,088,225 B2 1/2012 Goodman et al.
8,287,648 B2 10/2012 Reed et al.
8,366,830 B2 2/2013 Nakamura et al.
8,394,229 B2 3/2013 Aggarwal
8,801,857 B2 8/2014 Aggarwal
D743,357 S 11/2015 Vyne
9,202,727 B2 12/2015 Dunn et al.
9,558,985 B2 1/2017 Wang et al.
D784,276 S 4/2017 Tiner et al.
9,633,889 B2 4/2017 Cuvalci et al.
10,062,598 B2 8/2018 Ngo et al.
10,068,791 B2 9/2018 Parsey, Jr. et al.
D830,981 S 10/2018 Jeong et al.
10,242,890 B2 3/2019 Volfovski et al.
10,269,614 B2 4/2019 Chu et al.
10,376,916 B2 8/2019 Ranish et al.
D864,134 S 10/2019 Watarai et al.
10,930,543 B2 2/2021 Ngo et al.
D914,620 S 3/2021 Rokkam
11,018,047 B2 5/2021 Rokkam et al.
D920,936 S 6/2021 Rokkam
11,101,115 B2 8/2021 Kopec et al.
D958,764 S 7/2022 Rokkam
11,404,302 B2 8/2022 Singu et al.

(56) References Cited

U.S. PATENT DOCUMENTS

| | | | |
|---|---|---|---|
| 11,610,803 | B2 | 3/2023 | Xia |
| 11,961,756 | B2 * | 4/2024 | Rokkam ............ H10P 72/7611 |
| 2002/0011211 | A1 | 1/2002 | Halpin |
| 2002/0043337 | A1 | 4/2002 | Goodman et al. |
| 2003/0000472 | A1 | 1/2003 | Lim et al. |
| 2003/0049580 | A1 | 3/2003 | Goodman |
| 2003/0173031 | A1 | 9/2003 | Aggarwal et al. |
| 2004/0060512 | A1 | 4/2004 | Waldhauer et al. |
| 2004/0229002 | A1 | 11/2004 | Davis et al. |
| 2005/0092439 | A1 | 5/2005 | Keeton et al. |
| 2005/0284372 | A1 | 12/2005 | Murugesh et al. |
| 2006/0057826 | A1 | 3/2006 | De Boer |
| 2009/0068851 | A1 | 3/2009 | Hirata et al. |
| 2009/0175605 | A1 | 7/2009 | Kobayashi |
| 2009/0175606 | A1 | 7/2009 | Bezama et al. |
| 2009/0280248 | A1 | 11/2009 | Goodman et al. |
| 2010/0031884 | A1 | 2/2010 | Aggarwal et al. |
| 2010/0107974 | A1 | 5/2010 | Givens et al. |
| 2013/0109192 | A1 | 5/2013 | Hawkins et al. |
| 2013/0272686 | A1 | 10/2013 | Okada et al. |
| 2014/0094039 | A1 | 4/2014 | Ranish et al. |
| 2014/0113458 | A1 | 4/2014 | Pan et al. |
| 2015/0340266 | A1 | 11/2015 | Ngo et al. |
| 2016/0002778 | A1 | 1/2016 | Ravi et al. |
| 2016/0068996 | A1 | 3/2016 | Lau et al. |
| 2016/0133504 | A1 | 5/2016 | Chu et al. |
| 2016/0215393 | A1 | 7/2016 | Ramanathan et al. |
| 2018/0021818 | A1 | 1/2018 | VanHoomissen et al. |
| 2018/0094350 | A1 | 4/2018 | Verghese et al. |
| 2018/0166281 | A1 | 6/2018 | Fuse et al. |
| 2019/0355612 | A1 | 11/2019 | Sakurai |
| 2020/0109484 | A1 | 4/2020 | Yanagisawa |
| 2020/0234996 | A1 | 7/2020 | Rokkam et al. |
| 2020/0373131 | A1 | 11/2020 | Yamawaku et al. |
| 2020/0373187 | A1 | 11/2020 | Singu et al. |
| 2021/0125853 | A1 | 4/2021 | Rathi |
| 2021/0159111 | A1 | 5/2021 | Prengle |
| 2021/0280448 | A1 | 9/2021 | Ganguli et al. |

FOREIGN PATENT DOCUMENTS

| | | | |
|---|---|---|---|
| CN | 106463365 | A | 2/2017 |
| EP | 339279 | A2 | 11/1989 |
| EP | 445596 | A2 | 9/1991 |
| EP | 448346 | A1 | 9/1991 |
| EP | 634785 | A1 | 1/1995 |
| EP | 669640 | A1 | 8/1995 |
| EP | 766289 | A2 | 4/1997 |
| EP | 840358 | A2 | 5/1998 |
| GB | 2181458 | A | 4/1987 |
| JP | H07-58039 | A | 3/1995 |
| JP | 2000-269310 | A | 9/2000 |
| JP | 2002-184843 | A | 6/2002 |
| JP | 2002-526915 | A | 8/2002 |
| JP | 2003-124167 | A | 4/2003 |
| JP | 2006-124758 | A | 5/2006 |
| JP | 2006-228802 | A | 8/2006 |
| JP | 2007-502022 | A | 2/2007 |
| JP | 2008-124758 | A | 5/2008 |
| JP | 2009-070915 | A | 4/2009 |
| JP | 2011-023508 | A | 2/2011 |
| JP | 2011-193011 | A | 9/2011 |
| JP | 2012-084691 | A | 4/2012 |
| JP | 2013-157502 | A | 8/2013 |
| JP | D1422195 | S | 8/2014 |
| JP | D1547357 | S | 4/2016 |
| JP | D1570747 | S | 2/2018 |
| JP | D1570748 | S | 2/2018 |
| KR | 10-1999-0069084 | A | 9/1999 |
| KR | 1999-0069091 | A | 9/1999 |
| KR | 10-0460338 | B1 | 1/2005 |
| KR | 10-2007-0098025 | A | 10/2007 |
| KR | 10-2009-0062892 | A | 6/2009 |
| KR | 10-2013-0103604 | A | 9/2013 |
| TW | D111900 | S | 7/2006 |
| TW | D136587 | S | 8/2010 |
| TW | 201624608 | A | 7/2016 |
| TW | D184695 | S | 8/2017 |
| TW | D191199 | S | 6/2018 |
| WO | 1996/30713 | A1 | 10/1996 |
| WO | 1997/08743 | A1 | 3/1997 |
| WO | 2010/016964 | A2 | 2/2010 |
| WO | 2012/086012 | A1 | 6/2012 |

* cited by examiner

SUSCEPTOR FOR SEMICONDUCTOR SUBSTRATE PROCESSING

CROSS REFERENCE TO RELATED APPLICATIONS

This application is a divisional of prior U.S. patent application Ser. No. 17/075,504, filed Oct. 20, 2020, which application claims the benefit of priority to U.S. Provisional Patent Application No. 62/925,705, filed Oct. 24, 2019 and entitled "SUSCEPTOR FOR SEMICONDUCTOR SUBSTRATE PROCESSING," which applications are hereby incorporated by reference in their entirety herein. Any and all applications for which a foreign or domestic priority claim is identified in the Application Data Sheet as filed with the present application are hereby incorporated by reference under 37 CFR 1.57.

FIELD OF THE INVENTION

This disclosure relates generally to semiconductor processing, and more particularly to susceptors for supporting semiconductor substrates in processing chambers.

BACKGROUND

Semiconductor substrates, such as semiconductor wafers, are typically processed within a processing chamber under controlled process conditions, including exposure to elevated temperatures. A base, which is commonly referred to as a "susceptor," is usually used to support the substrate during processing (e.g., during a deposition) in the processing chamber. To facilitate automated processing, a robotic arm may be employed to place a substrate on a susceptor and subsequently, after processing, to remove it from the reactor.

A number of quality control issues related to the physical interaction between the substrate and the susceptor may arise during processing, and there is a continuing need to address these quality control issues.

SUMMARY

Various examples of susceptors for supporting semiconductor substrates and related processing systems and methods are disclosed.

In some embodiments, an apparatus is provided for processing a substrate comprises a processing chamber configured to accommodate a substrate and a susceptor disposed in the processing chamber and configured to support the substrate. The susceptor comprises an inner susceptor portion and an outer susceptor portion that encircles the inner susceptor portion. The inner susceptor portion includes a plurality of recesses and the outer susceptor portion includes a plurality of lobes extending under the inner susceptor portion to support the inner susceptor portion. Each of the lobes has a generally triangular shape and aligns within a corresponding one of the recesses. An apex of the triangular shape of the lobes protrudes toward a center of the inner susceptor portion.

In some other embodiments, a susceptor for supporting a substrate is provided. The susceptor comprises an inner susceptor portion, which includes a plurality of recesses, and an outer susceptor portion that encircles the inner susceptor portion. The outer susceptor portion includes a plurality of lobes extending under the inner susceptor portion to support the inner susceptor portion. Each of the lobes has a generally triangular shape and aligns within a corresponding one of the recesses, and an apex of the triangular shape of the lobes protrudes towards a center of the outer susceptor portion.

In yet other embodiments, an apparatus is provided for processing a substrate. The apparatus comprises a processing chamber configured to accommodate a substrate and a susceptor disposed in the processing chamber and configured to support the substrate. The susceptor comprises an inner susceptor portion and an outer susceptor portion that encircles the inner susceptor portion. The inner susceptor portion includes a plurality of contact pads extending outwards from and disposed along a perimeter of a surface of the inner susceptor portion, the pads configured to support the substrate and to prevent the substrate from contacting the surface during processing.

In yet other embodiments, a susceptor for supporting a substrate is provided. The susceptor comprises an inner susceptor portion, which comprises a plurality of contact pads extending outwards from and disposed proximate a perimeter of a surface of the inner susceptor portion. The pads are configured to support the substrate and to prevent the substrate from contacting the surface during processing. The susceptor also comprises an outer susceptor portion that encircles the inner susceptor portion.

In yet other embodiments, an apparatus for processing a substrate is provided. The apparatus comprises a processing chamber configured to accommodate a substrate, a susceptor disposed in the processing chamber and configured to support the substrate, and a thermocouple configured to measure a temperature of the susceptor. The susceptor comprises an inner susceptor portion and an outer susceptor portion that encircles the inner susceptor portion. The inner susceptor portion includes a cavity defining a volume for accommodating the thermocouple, the cavity being formed through an underside of a middle portion of the inner susceptor portion. A width of the cavity is larger than a width of the thermocouple, and the thermocouple is separated from walls of the cavity by an air gap.

In yet other embodiments, a method is provided for processing a substrate. The method comprises providing the substrate on a susceptor in a processing chamber. The susceptor comprises an inner susceptor portion and an outer susceptor portion that encircles the inner susceptor portion. The inner susceptor portion includes a cavity defining a volume for accommodating a thermocouple, the cavity being formed through an underside of a middle portion of the inner susceptor portion. The method further comprises providing a thermocouple in the cavity. The thermocouple is separated from walls of the cavity by an air gap. The method further comprises processing the substrate on the susceptor in the processing chamber. Processing the substrate comprises heating the substrate and the susceptor and the air gap is maintained during substrate processing.

Additional examples of embodiments are enumerated below.

Example 1. An apparatus for processing a substrate, the apparatus comprising:
- a processing chamber configured to accommodate a substrate; and
- a susceptor disposed in the processing chamber and configured to support the substrate,
- wherein the susceptor comprises an inner susceptor portion and an outer susceptor portion that encircles the inner susceptor portion,
- wherein the inner susceptor portion includes a plurality of recesses, and the outer susceptor portion includes a plurality of lobes extending under the inner susceptor portion to support the inner susceptor portion, wherein each of the lobes has a generally triangular shape and aligns within a corresponding one of the recesses, wherein an apex of the triangular shape of the lobes protrudes toward a center of the inner susceptor portion.

Example 2. The apparatus of example 1, wherein the inner susceptor portion is smaller than the substrate and the outer susceptor portion extends beyond the substrate.

Example 3. The apparatus of example 1, wherein the inner susceptor portion has a shape in which a first disc and a second disc concentrically overlap each other, the first disc having a diameter smaller than that of the second disc.

Example 4. The apparatus of example 1, wherein the outer susceptor portion includes a plurality of concentric annular top surfaces, each of the annular top surfaces disposed on a different vertical plane.

Example 5. The apparatus of example 1, wherein each lobe has a radial groove on an underside of the lobe.

Example 6. The apparatus of example 1, wherein edges of the lobe are chamfered.

Example 7. The apparatus of example 6, wherein the edges of the lobe have a chamfer angle in the range of 60° to 80°.

Example 8. The apparatus of example 1, wherein the inner susceptor has a concave shape corresponding to a concavity of the substrate during processing of the substrate, wherein the concave shape has a depth in the range of 0.1 mm to 1 mm.

Example 9. The apparatus of example 1, wherein the inner susceptor portion includes a plurality of contact pads along a perimeter of the inner susceptor portion, the pads protruding from a surface of the inner susceptor portion to support the substrate and prevent the substrate from contacting the surface.

Example 10. The apparatus of example 9, wherein the contact pads have a hemispherical shape.

Example 11. The apparatus of example 9, wherein a height of the pads is in the range of about 0.15 mm to 1 mm.

Example 12. A susceptor for supporting a substrate, the susceptor comprising:

- an inner susceptor portion, wherein the inner susceptor portion includes a plurality of recesses; and
- an outer susceptor portion that encircles the inner susceptor portion,
- wherein the outer susceptor portion includes a plurality of lobes extending under the inner susceptor portion to support the inner susceptor portion,
- wherein each of the lobes has a generally triangular shape and aligns within a corresponding one of the recesses, wherein an apex of the triangular shape of the lobes protrudes towards a center of the outer susceptor portion.

Example 13. The apparatus of example 12, wherein the inner susceptor portion is smaller than the substrate and the outer susceptor portion extends beyond the substrate.

Example 14. The apparatus of example 12, wherein the inner susceptor portion has a shape in which a first disc and a second disc concentrically overlap each other, the first disc having a diameter smaller than that of the second disc.

Example 15. The apparatus of example 12, wherein the outer susceptor portion includes a plurality of concentric annular top surfaces, each of the annular top surfaces disposed at a different vertical plane.

Example 16. The apparatus of example 12, wherein the at least one lobe has a groove on underside, the groove being generally triangular in shape with an apex facing in a radial direction from the center of the outer susceptor portion.

Example 17. The apparatus of example 12, wherein edges of the lobe are chamfered.

Example 18. The apparatus of example 17, wherein the edges of the lobe have a chamfer angle in the range of 60° to 80°.

Example 19. The apparatus of example 12, wherein the inner susceptor has a concave shape corresponding to a concavity of the substrate during processing of the substrate, wherein the concave shape has a depth in the range of 0.1 mm to 1 mm.

Example 20. The apparatus of example 12, wherein the inner susceptor portion includes a plurality of contact pads along a perimeter of the inner susceptor portion, the pads protruding from a surface of the inner susceptor portion to support the substrate and prevent the substrate from contacting the surface.

Example 21. An apparatus for processing a substrate, the apparatus comprising:

- a processing chamber configured to accommodate a substrate; and
- a susceptor disposed in the processing chamber and configured to support the substrate,
- wherein the susceptor comprises an inner susceptor portion and an outer susceptor portion that encircles the inner susceptor portion,
- wherein the inner susceptor portion includes a plurality of contact pads extending outwards from and disposed along a perimeter of a surface of the inner susceptor portion, the pads supporting the substrate and preventing the substrate from contacting the surface during processing.

Example 22. The apparatus of example 21, wherein the pads are integrally formed with the inner susceptor portion.

Example 23. The apparatus of example 22, wherein the pads have a hemispherical shape.

Example 24. The apparatus of example 22, wherein a height of the pads is in the range of about 0.15 mm to 1 mm.

Example 25. The apparatus of example 22, wherein a diameter of the pads is in a range of about 0.75 to 1.5 mm.

Example 26. The apparatus of example 21, wherein the inner susceptor portion has a concave shape corresponding to a concavity of the substrate during processing of the substrate, wherein the concave shape has a depth in the range of 0.1 mm to 1 mm.

Example 27. The apparatus of example 21, wherein the inner susceptor portion includes a plurality of center contact pads located proximate a center of the inner susceptor portion.

Example 28. The apparatus of example 27, wherein the center contact pads have a hemispherical shape.

Example 29. The apparatus of example 27, wherein a height of the center contact pads is in the range of about 0.05 mm to 1 mm.

Example 30. A susceptor for supporting a substrate, the susceptor comprising:

- an inner susceptor portion, wherein the inner susceptor portion comprises:

a plurality of contact pads extending outwards from and disposed proximate a perimeter of a surface of the inner susceptor portion, wherein the pads are configured to support the substrate and to prevent the substrate from contacting the surface during processing; and an outer susceptor portion that encircles the inner susceptor portion.

Example 31. The apparatus of example 30, wherein the pads are integrally formed with the inner susceptor portion.

Example 32. The apparatus of example 31, wherein the pads have a hemispherical shape.

Example 33. The apparatus of example 31, wherein a height of the pads is in the range of about 0.15 mm to 1 mm.

Example 34. The apparatus of example 31, wherein a diameter of the pads is in a range of about 0.75 mm to 1.5 mm.

Example 35. The apparatus of example 31, wherein the inner susceptor portion has a concave shape corresponding to a concavity of the substrate during processing of the substrate, wherein the concave shape has a depth in the range of 0.23 mm to 0.47 mm.

Example 36. The apparatus of example 30, wherein the inner susceptor portion includes a plurality of center contact pads located proximate a center of the inner susceptor portion.

Example 37. The apparatus of example 36, wherein the center contact pads have a hemispherical shape.

Example 38. The apparatus of example 36, wherein a height of the center contact pads is in the range of about 0.05 mm to 1 mm.

Example 39. An apparatus for processing a substrate, the apparatus comprising:

a processing chamber configured to accommodate a substrate;

a susceptor disposed in the processing chamber and configured to support the substrate; and a thermocouple configured to measure a temperature of the susceptor, wherein the susceptor comprises an inner susceptor portion and an outer susceptor portion that encircles the inner susceptor portion, wherein the inner susceptor portion includes a cavity defining a volume for accommodating the thermocouple, the cavity being formed through an underside of a middle portion of the inner susceptor portion, wherein a width of the cavity is larger than a width of the thermocouple, wherein the thermocouple is separated from walls of the cavity by an air gap.

Example 40. The apparatus of example 39, wherein a tip of the thermocouple is in contact with an upper end of the cavity.

Example 41. The apparatus of example 39, wherein a thickness of the inner susceptor portion above the thermocouple is about 1 mm or more.

Example 42. The apparatus of example 39, wherein a depth of the cavity is in the range of about 2.3 mm to 7.7 mm.

Example 43. The apparatus of example 39, wherein walls of the cavity define a cylinder.

Example 44. The apparatus of example 39, wherein an upper end of the cavity is flat.

Example 45. The apparatus of example 39, wherein a tip of the thermocouple inside the cavity is hemispherical.

Example 46. A method for processing a substrate, the method comprising:

providing the substrate on a susceptor in a processing chamber, wherein the susceptor comprises an inner susceptor portion and an outer susceptor portion that encircles the inner susceptor portion, and wherein the inner susceptor portion includes a cavity defining a volume for accommodating a thermocouple, the cavity being formed through an underside of a middle portion of the inner susceptor portion;

providing a thermocouple in the cavity, wherein the thermocouple is separated from walls of the cavity by an air gap; and processing the substrate on the susceptor in the processing chamber, wherein processing the substrate comprises heating the substrate and the susceptor, wherein the air gap is maintained during substrate processing.

Example 47. The method of example 46, wherein a tip of the thermocouple contacts an upper end of the cavity while processing the substrate.

Example 48. The method of example 46, wherein material forming the thermocouple has a higher coefficient of thermal expansion than material forming the susceptor.

Example 49. The method of example 46, wherein a thickness of the inner susceptor portion above the thermocouple is about 1 mm or more.

Example 50. The method of example 46, wherein a depth of the cavity is in the range of about 2.3 mm to 7.7 mm.

Example 51. The method of example 46, wherein the walls of the cavity define a cylinder.

Example 52. The method of example 46, wherein an upper end of the cavity is flat.

Example 53. The method of example 46, wherein a tip of the thermocouple is hemispherical.

DETAILED DESCRIPTION

Figure 1B:
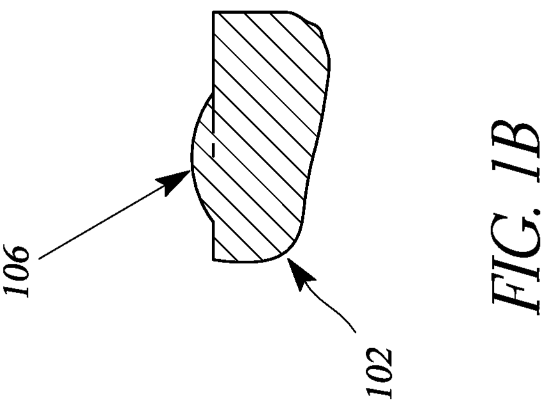
FIG. 1B is an example of a contact pad of an inner susceptor portion according to some embodiments.

As noted above, a number of quality control issues may arise during semiconductor processing, and many of these issues may relate to the physical interaction between the substrate and the susceptor. One issue that may occur when processing substrates supported on susceptors is backside damage; that is, damage to the side of the substrate facing the susceptor. In some cases, backside damage may undesirably cause optical artifacts that interfere with lithography and the subsequent patterning of features on the substrate.

It will be appreciated that backside damage may be caused by differential expansion and/or warping of substrates and underlying susceptors. Susceptors are typically made out of different materials than that forming the semiconductor substrate. Different materials may have different thermal expansion coefficients. Therefore, when substrates and susceptors are heated, they may expand at different rates, which causes abrasion when the different materials contact each other. Since susceptors are typically formed of harder materials than substrates, it is typically the substrates that are scratched or damaged by contact with the susceptor.

Advantageously, some embodiments described herein provide point contact between the substrate and the susceptor, and may provide high-quality process results with low levels of backside damage. For example, the susceptor may have a plurality of pads that contact an overlying substrate at discrete points along the periphery of the substrate. For example, 3 to 12, including 6 to 12, pads may be provided equally spaced on the top surface of the susceptor. Preferably, 6 or more pads are provided, which has been to guard against substrate contact with other parts of the susceptor as the substrate warps nonuniformly during heating. The pads may limit contact between the susceptor and substrate, thereby limiting the extent of backside damage. In addition, in some embodiments, a plurality of pads (1 to 6, or 3 to 6 pads) may be provided in a central region of the susceptor, to further limit susceptor-substrate contact in that region. In some embodiments, the contact pads in the central region may be roughly directly opposite from a cavity for accommodating a thermocouple on the underside of the susceptor.

As also noted above, semiconductor processing preferably occurs under tightly controlled conditions. One of these conditions is temperature. It will be appreciated that susceptors may impact the temperature uniformity across a substrate. Because many process results vary as a function of temperature (e.g., the amount of deposited material may vary depending on local temperature variations across the substrate), temperature nonuniformities across the substrate may impact the uniformity of process results across the substrate.

In some embodiments, multi-part susceptors may be utilized to facilitate automated substrate handling. The susceptors may have an inner portion that is smaller than the substrate and an outer portion that extends beyond the substrate. During processing, both the inner and outer portions may support the substrate. To allow substrate handling, the inner portion may be raised above the outer portion and, since the other portion is smaller than the substrate, a peripheral part of the substrate is exposed, allowing for the substrate to be contacted and handled by a robotic arm.

The outer susceptor portion may have a plurality of lobes that extend under the inner susceptor portion to support and integrate with that inner portion. Undesirably, the additional material of the lobes may cause temperature nonuniformities in the overlying substrate. In addition, many lobes fit within cavities on the bottom of the inner portion and may require precise alignment between the inner and the outer portions to allow the inner portion to be seated. In some embodiments, the lobes have a generally triangular shape, defined by curving sides which extend towards an apex pointed towards the interior of the susceptor. The generally triangular shape facilitates self-alignment of a lobe within a recess on the bottom of the inner portion, which advantageously provides a low-mass support that does not extend appreciably under an overlying substrate. For example, the triangular shape advantageously reduces the amount of material extending under the substrate, relative to a rectangular-shaped lobe. In some embodiments, the lobes interlock with or fit within a similarly shaped recess on the bottom of the inner portion; thus, the lobes and recesses may be said to have complementary shapes which are similar and fit within one another. The recess may have angled sidewalls that provides a relatively large recess opening which is progressively narrower inside of the recess. In some embodiments, the underside of the lobes may have a divot, or cutout, to further reduce the mass of those lobes, thereby further reducing the impact of those lobes on temperature.

It will be appreciated that another source of deviations from ideal process results may be due to inaccuracies in setting the temperatures for processing due to inaccurate thermocouple readings. In some embodiments, the susceptor may include an opening which accommodates a thermocouple for measuring the surface temperature of the susceptor (e.g., the temperature of the upper surface of the susceptor, the upper surface directly facing an overlying substrate upon retention of the substrate on the susceptor). Preferably, the opening is sized to maintain an air gap between sidewalls of the opening and sidewalls of the thermocouple, such that the gap is maintained during processing and accounts for higher coefficients of thermal expansion in the thermocouple relative to the susceptor. In some embodiments, only the top of the thermocouple, which is closest to the susceptor's upper surface, contacts the body of susceptor. In some other embodiments, an air gap is maintained between the sides of the thermocouple and the opening and the top of the opening. The skilled artisan will appreciate that the air gap may contain gas, including inert gas, and may be under a partial vacuum under process conditions. Preferably, the volume is devoid of solid material which may cause conductive heat transfer between the thermocouple and the susceptor.

Reference will now be made to the figures, in which like numerals refer to like parts throughout. It will be appreciated that the figures not necessarily to scale.

As noted herein, to facilitate substrate handling, a susceptor may take the form of an assembly that includes multiple separable sections, e.g., two sections which may include an inner susceptor portion and an outer susceptor portion. It will be appreciated that the multi-portion susceptor disclosed herein may be used in various semiconductor processing systems, an example of which is shown in FIG. 8.

Figure 8:
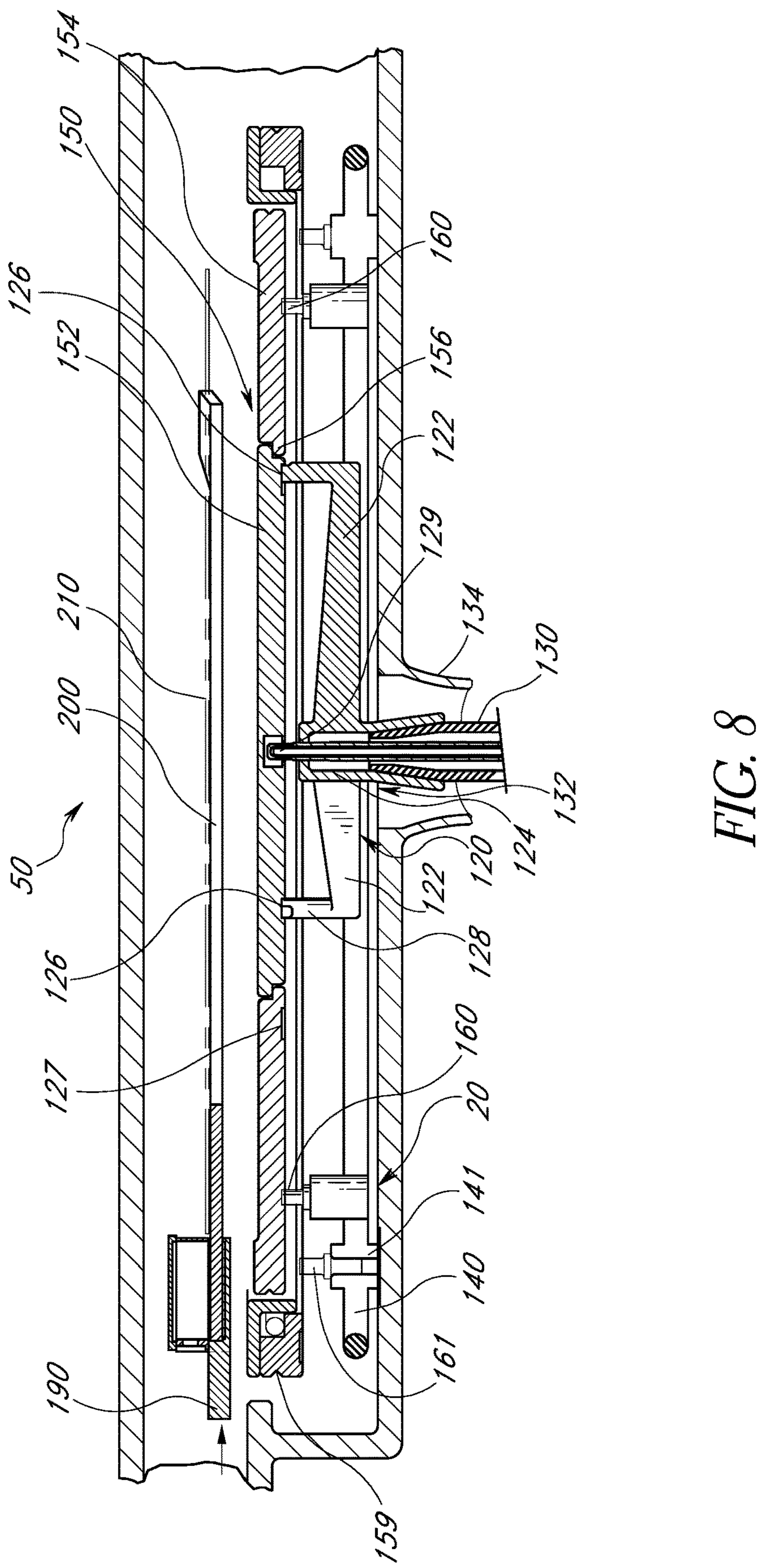
FIG. 8 schematically shows a cross-sectional sideview of a semiconductor processing system according to some embodiments.

FIG. 8 schematically shows a cross-sectional sideview of a semiconductor processing system according to some embodiments. As illustrated, the processing system may include a susceptor 150 having both an inner susceptor portion 152 and an outer susceptor portion 154. The inner susceptor portion 152 and the outer susceptor portion 154 may fit together during processing to together support a semiconductor substrate 210.

FIG. 8 further shows the processing chamber 50 in detail. From this cross-sectional view it can be seen that the outer susceptor portion 154 may both surround and provide vertical support for the inner susceptor portion 152. This vertical support may consist of complementary protruding flanges 156, which are also referred to as lobes, as discussed further herein. The outer susceptor portion 154 may protrude radially inward along its lower inside margin to provide a supportive lobe 156, which may fit into a complementary recess on the underside of the inner susceptor portion 152. When the susceptor unit is in its lowest position, the outer susceptor portion 154 may rest on a plurality of supports 160. A drive shaft 130 may enter the processing chamber through an opening 132 in the bottom of the chamber, the walls of the chamber being continuous with a sleeve 134 that surrounds the drive shaft 130. The upper end of the drive shaft 130 may articulate with a support spider 120, located under the susceptor unit within the processing chamber. The spider 120 may have a plurality of support elements, or arms 122, which radiate outward from a central hub 124. The distal ends of the arms 122 may terminate in support posts or pins 128 which may fit within recessed seats 126 and 127 in the lower surfaces of the inner or outer susceptor portions, respectively (in this illustration, the spider is shown engaging the inner portion 152). The articulation between the spider arms 122 and the recessed seats 126 may provide a positive coupling means for effecting the rotational movement of the susceptor 150, and maintaining concentricity of the spider and susceptor during thermal expansions.

Figures 7A, 7B:
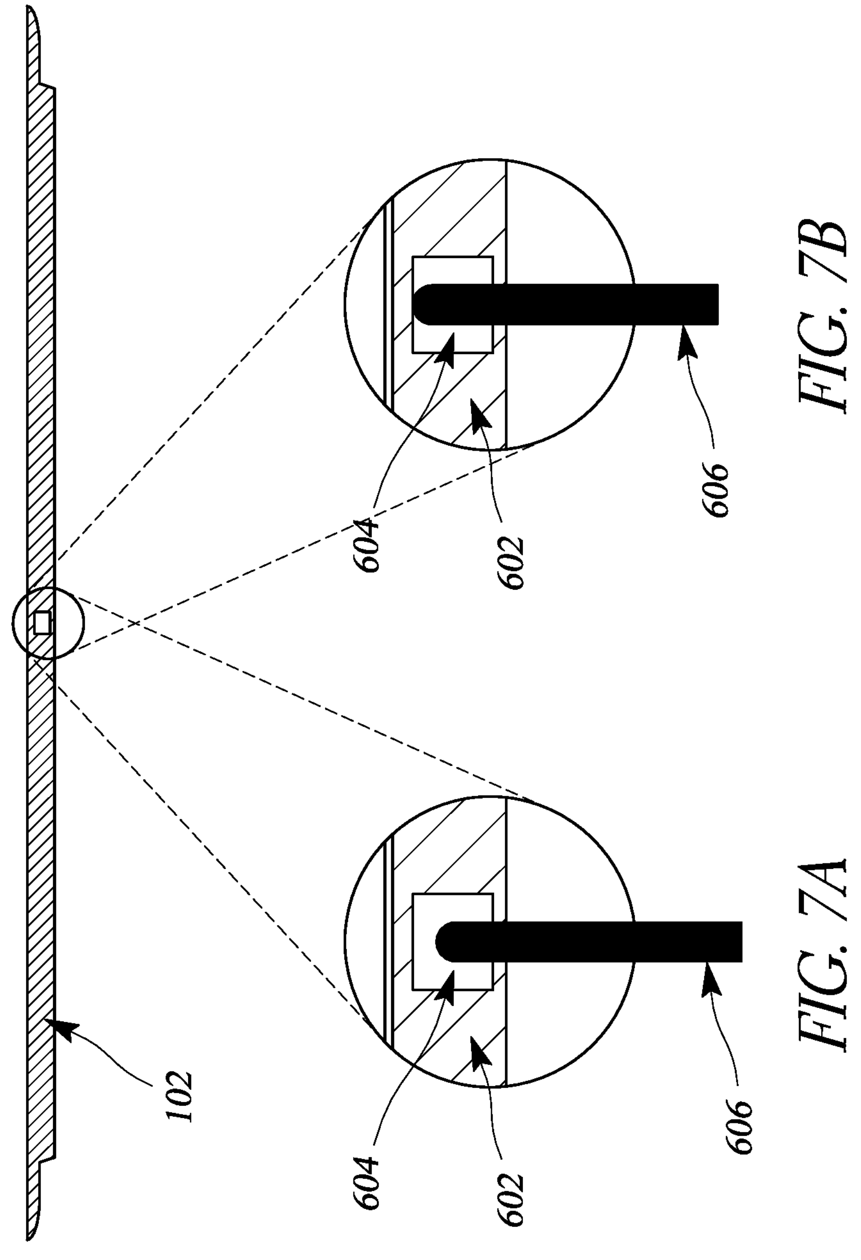
FIGS. 7A and 7B are cross-sectional sideviews of an inner susceptor portion according to some embodiments.

The susceptor 150 may be surrounded by a temperature compensation ring 159 supported on pegs 161 extending upwardly from a support ring 140 having legs 141 resting on the bottom wall 20 of the chamber. A thermocouple 129 may be inserted through the ring 159 to sense the temperature of the ring and susceptor in that area. The thermocouple 129 may be inserted into the susceptor via a cavity 125 on the bottom surface of the inner susceptor portion 152, near the center of the inner susceptor portion. The thermocouple 129 may be surrounded by an air gap such that at least the sides of the thermocouple 129 do not contact the susceptor 150, for example as depicted in FIGS. 7A and 7B.

FIG. 8 also illustrates a robotic arm 190, having an end effector 200 disposed on its distal end and carrying a wafer 210. The robotic arm may enter the processing chamber from an access port (located to the left). The end effector 200 may have a forked end that cradles the wafer on support arms 202, leaving between the arms an open area which is sufficiently large to accommodate the inner susceptor portion 152. Consequently, the inner susceptor portion can travel vertically between the open arms 202 of the end effector, thereby picking up (loading) an unprocessed wafer and the reverse sequence may be performed for unloading a processed substrate 210. The arm 190 may be subsequently retracted and, during processing, the substrate 210, sitting on the inner susceptor portion 152, is heated and gas is flowed into the processing chamber 50. During processing, even at elevated process temperatures, in some embodiments, the cavity 125 is sufficiently wide that the sides of the thermocouple 129 avoid contact with the susceptor 150; that is, an air gap is maintained between the sides of the thermocouple 129 and the susceptor 150 during processing. As discussed further herein, such an arrangement may have advantages for providing accurate temperature measurements and, as a result, high-quality process results.

Figure 9:
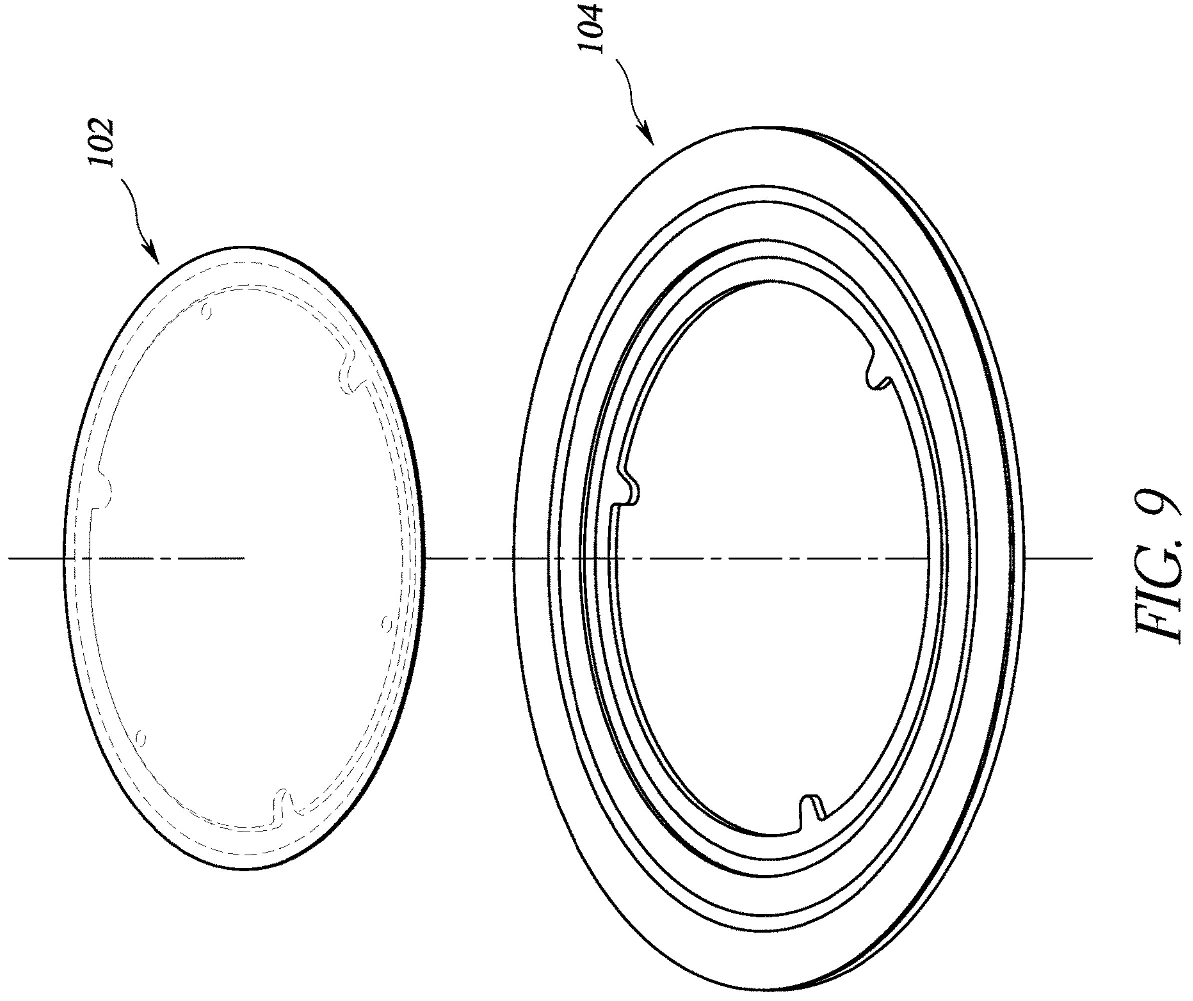
FIG. 9 is a perspective exploded view of a susceptor including an inner susceptor portion and an outer susceptor portion according to some embodiments.

With reference now to FIG. 9, a perspective exploded view is illustrated of a susceptor including an inner susceptor portion 102 and an outer susceptor 104 according to some embodiments. FIG. 9 illustrates how a susceptor with inner and outer portions may be separated for substrate loading and unloading. It will be appreciated that the inner susceptor portion 102 has a smaller area than a substrate to be retained on that inner portion 102. The inner susceptor portion 102 may be raised out of the outer susceptor 104 during substrate loading and unloading. For example, a substrate may be loaded onto the inner portion 102 using a robot arm (not shown) that contacts portions of the substrate that extend beyond the inner susceptor portion 102. Thus, the robot arm may lower a substrate onto the inner susceptor portion 102 and then retract. The inner susceptor portion 102 may then be lowered onto the outer susceptor portion 104. Raising and lowering the inner susceptor portion 102 may be accomplished using, e.g., lift pins that contact and move up and down the inner susceptor portion 102 without moving the outer susceptor portion 104. To provide access to a retained semiconductor substrate during substrate unloading, the inner susceptor portion 102 may be raised and a robot arm extended under the substrate to contact and lift away the substrate.

Figure 1A:
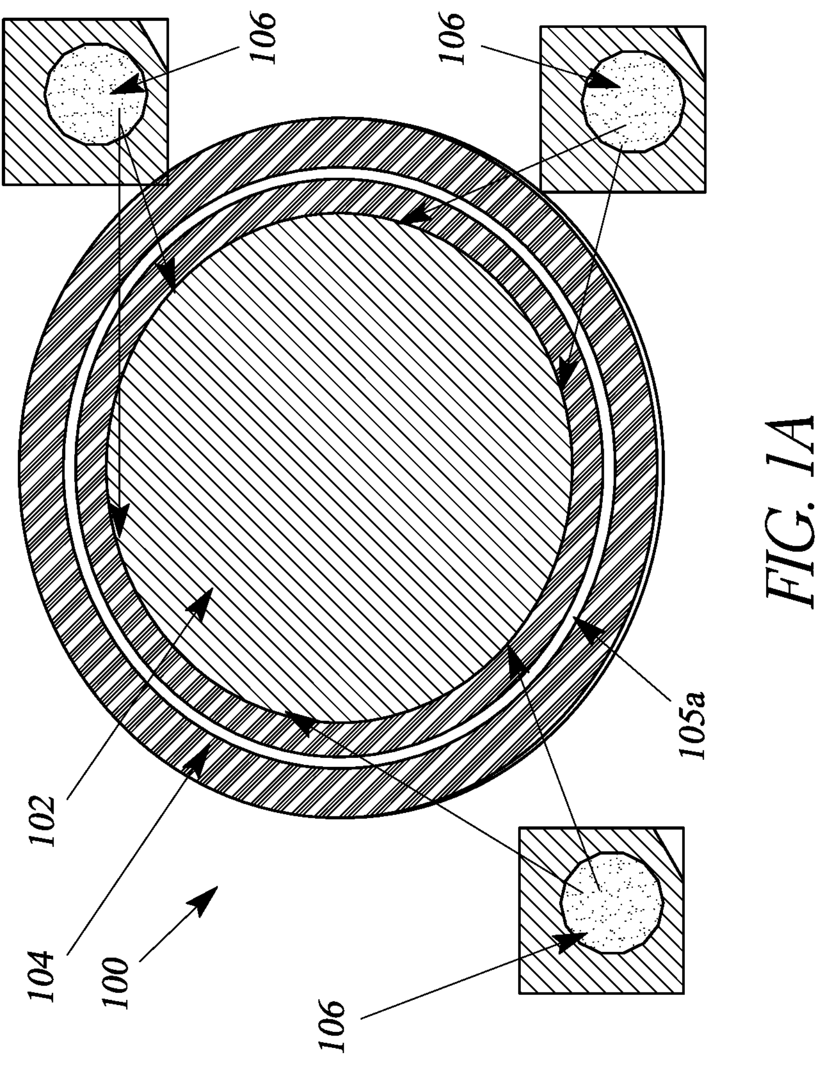
FIG. 1A is a top-down perspective view of a susceptor including an inner susceptor portion and an outer susceptor portion according to some embodiments.

FIG. 1A illustrates a top-down perspective view of a susceptor 100 including an inner susceptor portion 102 and an outer susceptor portion 104. The inner susceptor portion 102 may be encircled by the outer susceptor portion 104. It will be appreciated that the susceptor 100 may correspond to the susceptor 150 of FIG. 8 and the susceptor of FIG. 9, and the inner susceptor portion 102 and the outer susceptor portion 104 may correspond to the inner susceptor portion 152 and the outer susceptor portion 154, respectively (FIG. 8). In some embodiments, the susceptor 100 may be formed by machining graphite into a desired shape and applying a silicon carbide (SiC) coating. The susceptor 100 may be formed in different shapes, but preferably matches the shape of the substrate to be supported. For example, for circular semiconductor substrates such as semiconductor wafers, the susceptor 100 may be circular, and both the inner susceptor portion 102 and the outer susceptor portion 104 may be circular (e.g., the inner susceptor portion 102 may generally be in the shape of a circular plate and the outer susceptor portion 104 may be in the shape of a flattened ring that encircles the inner susceptor portion 102).

The outer susceptor portion 104 may include a ledge 105*a*, which may include a bezel that slopes or is inclined upward toward an outer edge of the outer susceptor portion 104. Preferably, the bezel is positioned to extend around the perimeter of the substrate upon retention of a substrate on the susceptor 100. In some embodiments, when a substrate is supported by the inner susceptor portion 102, the ledge 105*a* may contact the substrate due to the upward inclination of the ledge 105*a*. In some embodiments, the contact between the ledge 105*a* and the substrate may prevent the substrate from moving, which may aid in decreasing substrate backside damage.

The inner susceptor portion 102 may include a plurality of contact pads or bumps 106 along the perimeter of the inner susceptor portion 102. The contact pads 106 may be on the top surface of the inner susceptor portion 102. When the inner susceptor portion 102 holds a substrate, the plurality of contact pads 106 will contact the substrate. Advantageously, the plurality of contact pads 106 provides support for the substrate while, in the aggregate, contacting only a small surface area of the substrate, which can reduce the instances of backside damage that may occur during wafer processing and handling.

In some embodiments, the plurality of contact pads 106 are separated by equal distances around the perimeter of the inner susceptor portion 102. In some embodiments, the contact pads 106 are disposed immediately proximate the edge of the inner susceptor portion 102. The plurality of contact pads 106 total three or more, three to twelve contact pads, or six to twelve contact pads in some embodiments. While only three contact pads may be needed to define a plane and support a substrate, it has been found that six contact pads advantageously addresses nonuniform substrate warping during heating and processing (e.g., such as during epitaxial silicon deposition). Even with this warping, the six contact pads are believed to provide sufficient contact with warped portions to prevent contact between the substrate and the main surface of the inner susceptor portion 102.

With continued reference to FIG. 1A, in some embodiments, the plurality of contact pads 106 may be integrally formed with the inner susceptor portion 102, which provides good thermal stability and integrity for the contact pads. For example, the contact pads 106 may be machined to form on the inner susceptor portion 102. In some other embodiments, the contact pads 106 may be separately formed and attached to the main body of the inner susceptor portion 102. It will be appreciated that the contact pads 106 may have various shapes. For example, the contact pads 106 may be hemispherical shaped mounds as illustrated in FIG. 1B, which may provide a relatively small surface area in contact with the substrate. In some other embodiments, the plurality of contact pads 106 may be cylindrically shaped. The diameter of the contact pad 106 may be in a range of about 0.5 mm to 3 mm, 0.5 mm to 2 mm, 0.75 mm to 1.50 mm, including about 1 mm in some embodiments. The contact pads 106 may have a symmetrical cross-sectional shape as seen in a top-down view (e.g., generally circular, or multi-sided, such as hexagonal, orthogonal, etc.). The shape of the contact pads 106 may be configured to provide good substrate stability with a low amount of contact area with the overlying substrate. In some embodiments, the plurality of contact pads 106 may be polished, which may provide a more uniform contact surface with the substrate, while the other portions of the inner susceptor portion may not be polished. The polish may provide a roughness of less than 0.4 micron Ra, less than 0.3 micron Ra, or less than 0.2 micron Ra on at least the top surface of the contact pads 106 which are expected to contact the overlying substrate. In some other embodiments, the plurality of contact pads 106 may not be polished.

Preferably, the height of the contact pads is sufficient to allow air to escape between inner susceptor portion 102 and the substrate at a sufficiently high rate to prevent a gas cushion that causes undesired lateral substrate movement during substrate loading when the substrate is lowered onto the inner susceptor portion 102. In some embodiments, radial grooves may be provided in the surface of the inner susceptor portion 102 to form vents that aid in the escape of gas away from the inner susceptor portion 102 during substrate loading. In addition, the height of the contact pads 106 may be selected to sufficiently space the substrate and inner susceptor portion 102 to account for substrate warping during processing. In some embodiments, the height of the contact pads may be in the range of about 0.10 mm to 1 mm, about 0.10 mm to 0.5 mm, or about 0.15 mm to 0.2 mm. In some embodiments, the height is about 0.18 mm. In some embodiments, no grooves are present and the top surface of the inner susceptor portion 102 is flat except for contact pads 106.

Figure 2:
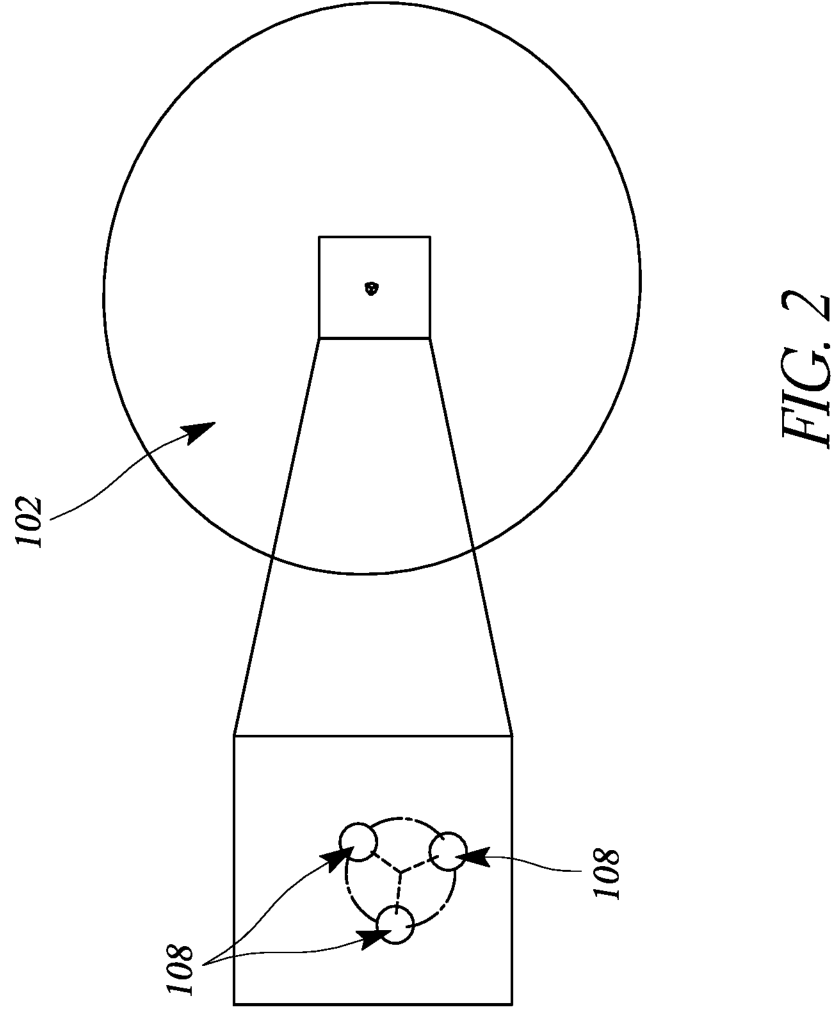
FIG. 2 is a top-down perspective view of an inner susceptor portion according to some embodiments.

FIG. 2 illustrates a top-down perspective view of the inner susceptor portion 102 with an additional plurality of center contact pads 108. The center contact pads 108 are located in an inner region on the substrate-facing upper surface of the inner susceptor portion 102, inward of the contact pads 106. For example, the center contact pads 108 may be located proximate the center of the inner susceptor portion 102, and may encircle a center point of the inner susceptor portion 102. These center contact pads 108 allow the inner susceptor portion 102 to contact and support central regions of an overlying substrate, and to prevent contact with the upper, main susceptor surface if the substrate deforms during processing (e.g. if the central region of the substrate sags during processing). The plurality of center contact pads 108 may total one to six, or three to six contact pads in some embodiments. In some embodiments, the inner susceptor portion 102 may include three total center contact pads 108.

It will be appreciated that the above-noted compositions, and/or shapes for the contact pads 106 apply to the center contact pads 108. For example, center contact pads 108 may be hemispherical shaped mounds which are integrally formed with the main body of the inner susceptor portion 102. The center contact pads 108 may be cylindrically shaped in some embodiments. The center contact pads 108 may have symmetrical cross-sections, as seen in a top-down view. In some embodiments, the height of the center contact pads 108 may be less than the heights of the contact pads 106, which may aid in addressing substrate blowing or deformation during processing. For example, the heights of individual ones of the center contact pads 100 may be in the range of about 0.05 mm to 1 mm, about 0.05 mm to 0.5 mm, or about 0.05 mm to 0.2 mm in some embodiments. In some embodiments, the height may be about 0.1 mm. In some embodiments, the contact pads 106 and center contact pads 108 may have similar shapes and heights. In some other embodiments, the contact pads 106 and center contact pads 18 may have different shapes and/or heights.

Figure 3:
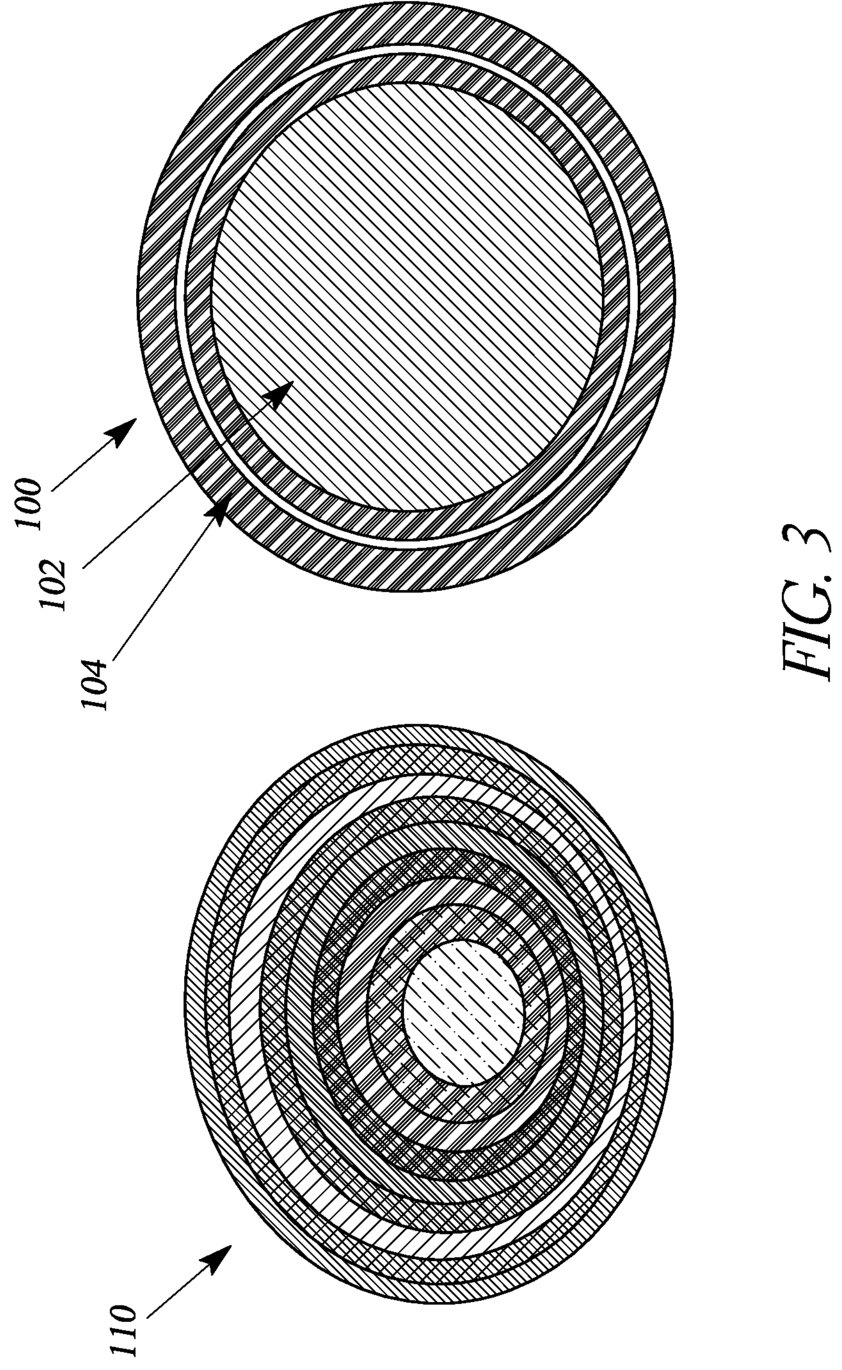
FIG. 3 is a top-down perspective view of a susceptor including an inner susceptor portion and an outer susceptor portion with a corresponding depth plot showing susceptor concavity according to some embodiments.

With reference now to FIG. 3, a top-down perspective view is illustrated of the susceptor 100 including the inner susceptor portion 102 and outer susceptor portion 104. Also illustrated is an example of a corresponding depth plot 110 for the inner susceptor portion 102. During heating, it has been observed that a substrate may deform or bow due to various mechanisms including differential thermal expansion of the substrate. For example, the substrate may bow so that its innermost portion is at the greatest depth and the substrate has gradually reducing depth with decreasing distance to the edge of the substrate; thus, the substrate may form a concave shape. In some embodiments, providing the susceptor 100 with a concavity corresponding to the wafer bowing may reduce backside damage. In order to compensate for this deformation causing the substrate to have a concavity, the susceptor assembly 100 may also include a substantially matching concavity.

With continued reference to FIG. 3, the depth plot 110 illustrates an example of concavity of the susceptor 100. The center region is at the greatest depth, and the other various patterns depict, from inside to outside, gradually reducing depth until the shallowest depth along the perimeter. While, for ease of illustration, the depth plot 110 depicts the depths in what appears to rigid depth changes (from section to section), the depth actually changes gradually.

In some embodiments, the maximum depth at the center of the susceptor 100, as depicted in the depth plot 110 may be in the range of about 0.1 mm to 1 mm, about to 0.8 mm, or about 0.23 mm to 0.47 mm. In some embodiments, the depth at the center of the susceptor may be about 0.35 mm.

In some other embodiments, the maximum depth at the center of the susceptor 100, as depicted in the depth plot 110 may be in the range of about 0.4 mm to 1 mm. In some embodiments, the depth at the center of the susceptor may be about 0.48 mm. Further, the spherical radius of the susceptor 100 may be 19000 mm to 25000 mm, or 21901.28 mm in some embodiments. To achieve the total susceptor depth described herein, the inner susceptor portion 102 may have a depth in the range of about 0.1 mm to 0.4 mm and the outer susceptor portion 104 may have a depth in the range of about 0.4 mm to 1 mm in some embodiments. In some embodiments, the depth at the center of the inner susceptor portion 102 may be about and the depth at the center of the outer susceptor portion 104 may be about 0.48 mm.

Figure 4A:
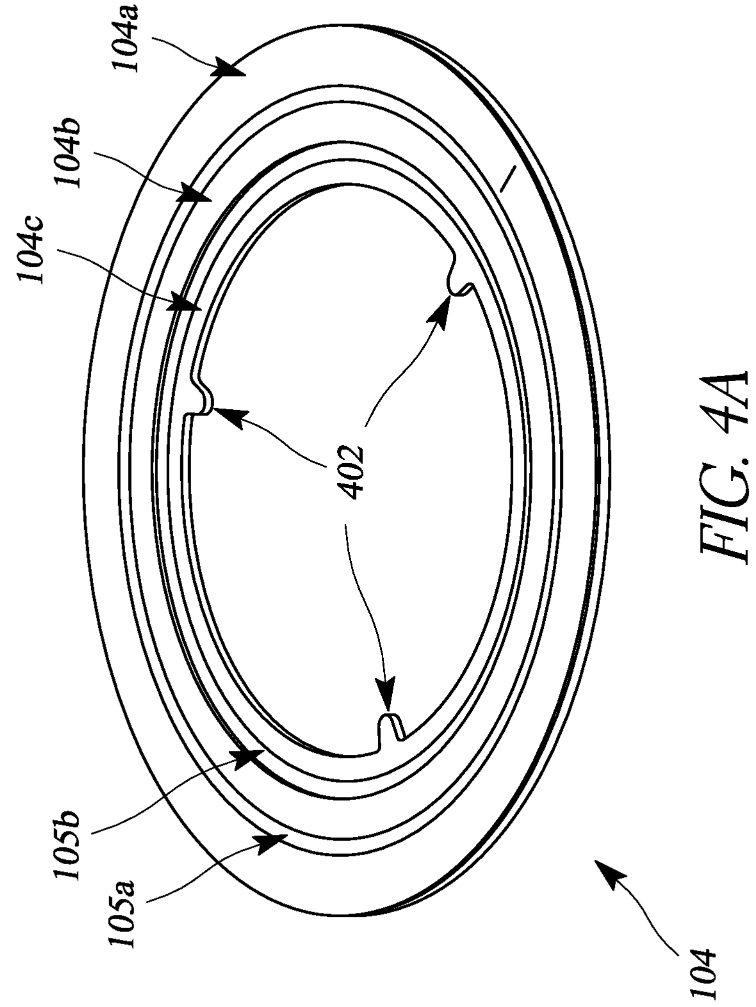
FIG. 4A is a perspective view of an outer susceptor portion according to some embodiments.

With reference now to FIG. 4A, a perspective view is illustrated of the outer susceptor portion 104. In some embodiments, the outer susceptor portion 104 may have a diameter in the range of about 330 mm to 370 mm, about 340 mm to 360 mm, or about 351.53 mm to 352.05 mm. In some embodiments, the diameter of the outer susceptor portion may be about 351.79 mm. The diameter of the outer susceptor portion 104 may depend on the size of the semiconductor being processed. Since the outer susceptor portion 104 preferably supports the inner susceptor portion 102, the outer susceptor portion 104 diameter may be derived from the wafer diameter. In some embodiments, the outer susceptor portion 104 may have a thickness in the range of about 4 mm to 8 mm, about 5 mm to 7 mm, or about 6.09 mm to 6.61 mm. In some embodiments, the thickness of the outer susceptor portion may be about 6.35 mm. As with the diameter, the thickness of the outer susceptor portion 104 may be influenced by the thickness of the semiconductor and inner susceptor portion 102. Because the outer susceptor portion is made of layers of surfaces (including surfaces at different elevations, as explained below), each layer's thickness may depend on the thickness of the inner susceptor portion 102 being supported by the layer. In turn, the thickness of the inner susceptor portion 102 may depend on the thickness of the wafer. In some embodiments, the hole in the center of the outer susceptor portion 104, defined by the inner edge of the lowest top surface 104*c* (as described below), may have a diameter in the range of about 200 mm to 250 mm, about 210 mm to 240 mm, or about 225.34 mm to 225.4 mm. In some embodiments, the inner diameter of the top surface 104*b* may be about 225.37 mm. The inner diameter of the outer susceptor portion 104 may also depend on the size of the semiconductor being processed. The inner edge of the outer susceptor portion 104 annulus may support the inner susceptor portion 102 and may therefore be sized to accommodate the inner susceptor portion 102. The inner susceptor portion 102 may be sized to accommodate the wafer.

With continued reference to FIG. 4A, the outer susceptor portion 104 may have a plurality of top surfaces 104*a*, 104*b*, 104*c* at different elevations, each top surface being disposed on a different plane (at a different vertical level) as illustrated in FIG. 4A. The top surfaces 104*a*, 104*b*, 104*c* may have a doughnut or ring shape. The top surfaces 104*a*, 104*b*, 104*c* may be aligned along a shared central axis such that the top surfaces 104*a*, 104*b*, 104*c* are concentric to each other when regarded in a top-down view. The top surfaces 104*a*, 104*b*, 104*c* may align with discs of the inner susceptor portion 102 such that the outer susceptor portion and the inner susceptor portion interlock, thereby holding the components in place relative to each other (e.g., as described in relation to FIG. 9). The outer susceptor portion 104 may comprise ledges 105*a*, 105*b*. The ledge 105*a* connects the top surfaces 104*a*, 104*b*, and the ledge 105*b* connects the top surface 104*b* and 104*c*. The ledges 105*a*, 105*b* may slant relative to the top surfaces 104*a*, 104*b*, 104*c* (e.g., the ledges 105*a*, 105*b* may be angled downwards towards the top surfaces 104*b* and 104*c*, respectively). As described above, the outer susceptor portion 104 supports the inner susceptor portion 102, which in turn supports a substrate during processing. In order to securely hold the inner susceptor portion 102 in place, the outer susceptor portion 104 may include a plurality of lobes or tabs 402, which contact and support the inner susceptor portion 102 (FIG. 1A). In some embodiments, the lowest top surface 104*c* may have the tabs 402. In some other embodiments, the other top surfaces 104*a*, 104*b* may have the tabs 402. In some embodiments, the number of tabs 402 may be three tabs. However, the number of tabs may be selected for ease of manufacture while still securely holding the inner susceptor portion 102. Preferably, the outer susceptor portion includes 3 or more tabs 402. In some embodiments, the tab 402 may have a length in the range of about to about 9 mm, about 6 mm to 8 mm, about 6.87 mm to 7.13 mm. In some embodiments, the length of the tab may be about 7 mm.

In embodiments where the tabs 402 are located on the same plane as the lowest top surface 104*c*, the lowest top surface 104*c* may form an inner slot on which the inner susceptor portion may rest. The distance between the lowest top surface 104*c* and the next surface 104*b* may be the inner slot depth. In some embodiments, the inner slot may have a diameter in the range of about 200 mm to 300 mm, about 230 mm to 270 mm, or about 244.16 mm to 244.32 mm. In some embodiments, the diameter of the inner slot may be about 244.24 mm. The inner slot may have a depth in the range of about 2 mm to 3 mm, about 2 mm to 2.5 mm, or about 2.26 mm to 2.36 mm. In some embodiments, the inner slot depth may be about 2.31 mm.

Figure 4B:
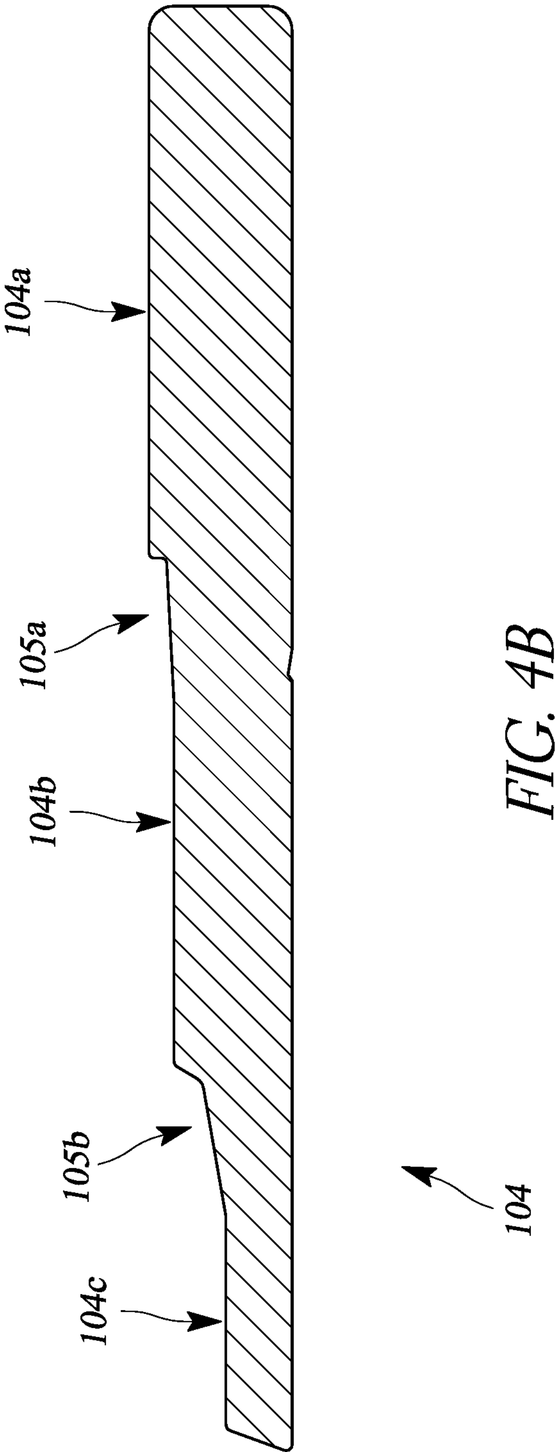
FIG. 4B is a cross-sectional sideview of an outer susceptor portion according to some embodiments.

FIG. 4B is a side view cross section of an outer susceptor portion according to some embodiments. The ledge 105*a*, 105*b* may be inclined upwards at an angle in a range of about 2.9°-3.1°, or about 2.95°-3.05° relative to a horizontal axis of the susceptor (e.g., a horizontal plane on which the susceptor sits). In some embodiments, the angle may be about 3°. The ledge may be entirely polished or may be polished only at the bevel. In some embodiments, the ledge may have an average roughness profile Ra of about 0.4 micron Ra or less, about 0.3 micron Ra or less, or about 0.2 microns or less.

Figure 4C:
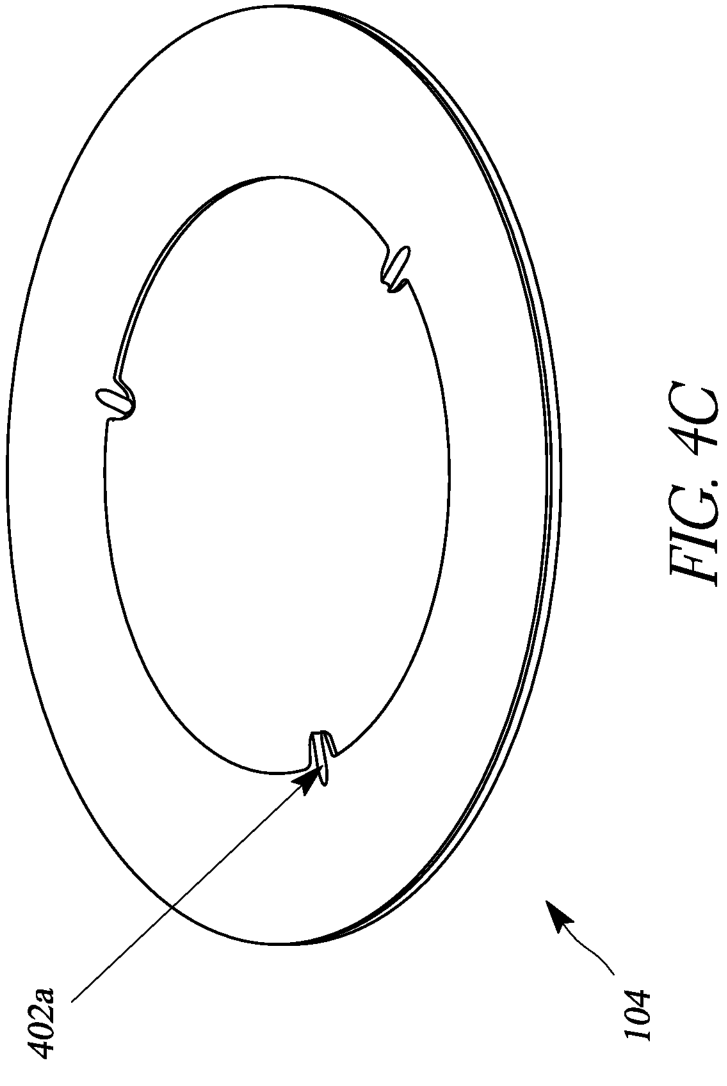
FIG. 4C is a perspective view of the underside of an outer susceptor portion according to some embodiments.
Figure 5:
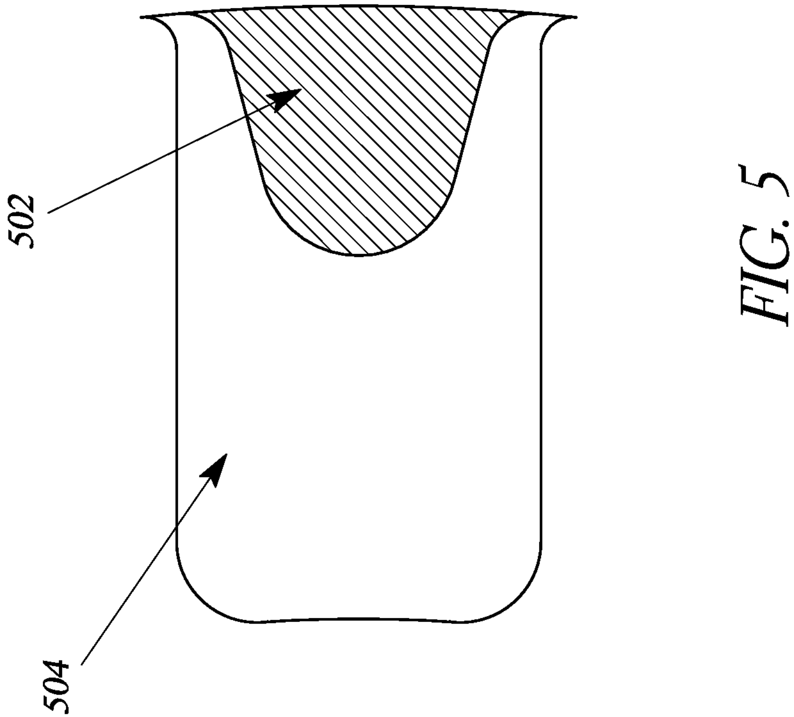
FIG. 5 is a comparison between two example shapes for lobes of an outer susceptor according to some embodiments.

FIG. 4C is a perspective view of the underside of an outer susceptor portion according to some embodiments. With reference now to FIG. 4C, a groove 402*a* is formed on an underside of each tab 402. The groove 402*a* may be formed from an apex of the generally triangular shape in radial direction. The groove 402*a* may have a V-shaped cross-sectional shape, as viewed in a cross-section taken along a plane transverse to the radial axis. The groove 402*a* may reduce the thermal mass of the tab 402, which may reduce the impact of the tab 402 on the temperature across the inner susceptor portion 102, for example by reducing the amount of heat absorbed by the tab 402. The inner susceptor portion 102 may thus maintain a more uniform temperate across its surface when the inner susceptor portion 102 is in contact with the tab 402 during substrate processing. In turn, a more uniform temperature may be maintained across the entire substrate, which may reduce substrate temperature nonuniformities and related processing nonuniformities. It will be appreciated that the groove 402*a* may be shaped and sized to accommodate a susceptor support pin or other support structure. It has been found that the shape of the tabs 402 may further determine the amount of temperature non-uniformity and also the ease of alignment of the inner susceptor portion 102 with the outer susceptor portion 104. With reference now to FIG. 5, a comparison between two example shapes for the tabs 402 is illustrated. The first tab shape 504 is generally rectangular whereas the second tab shape 502 is generally triangular. In some embodiments, the second tab shape 502 may be understood to be generally triangular in the sense that the main expanses of the sides of that shape are angled such that, if extended, they converge on a common point. In contrast, the main expanses of the sides of the generally rectangular first tab shape 504 are parallel and may be extended out towards infinity without converging.

With continued reference to FIG. 5, the second tab shape 502 has a reduced perimeter length and reduced contact area when compared to the first tab shape 504. The area of the second tab shape 502 may be equal to or less than half of the area of first tab shape 504. In some embodiments, the area of second tab shape 502 is around 24% of the area of the first tab shape 504. Further, the perimeter length of the second tab shape 502 may also be equal to or less than half of the area of the first tab shape 504. In some embodiments, the length of the perimeter of the second tab shape 502 is around 43% of the circumference of the first tab shape 504. The plurality of tabs are the contact points between the inner susceptor portion 102 and the outer susceptor portion 104 and therefore a tab with a smaller surface area will provide a smaller contact surface area, which may reduce the area and/or temperature non-uniformity across the substrate.

The substantially triangular tab design of the second tab shape 502 may provide a self-centering action when aligning the inner susceptor portion 102 with the outer susceptor portion 104, particularly when compared to the substantially rectangular shape of the first tab shape 504. In some embodiments, the edges of the first tab shape 504 and the second tab shape 502 may be chamfered to further facilitate self-centering. For example, with the tabs 502 and 504 oriented flat horizontally, the walls of the edges of the tabs may be understood to be sloped at an angle such that the lower portions of the tabs occupy a larger area than upper portions of the tabs. In some embodiments, the edge chamfer (the angle formed by the edge in a horizontal plane on which the outer susceptor portion 104 lies flat) may be between in the range of about 60°-80°, about 62°-78°, about 64°-76°, about 65°-75°, about 66°-74°, about 67°-73°, about 68°-72°, or about 69°-71°. In some embodiments, the edge chamfer may be about 70°.

Figure 6:
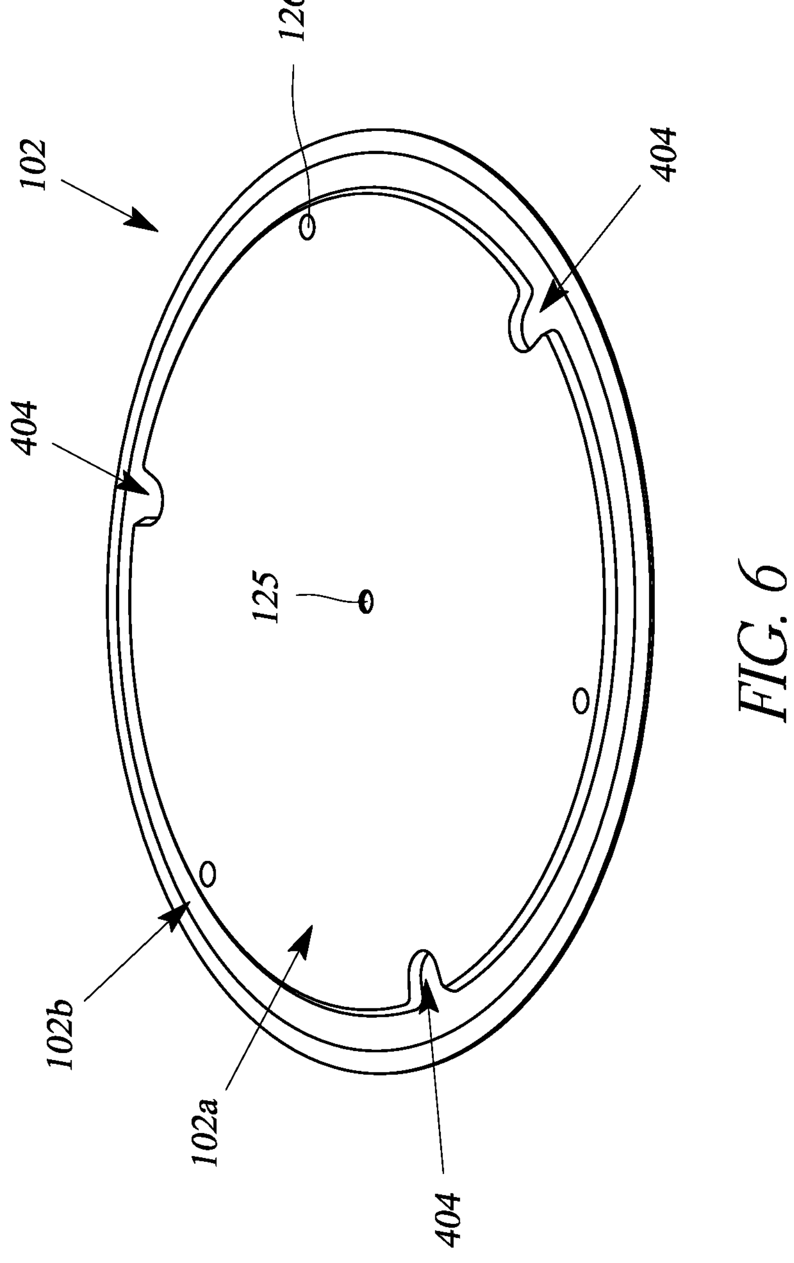
FIG. 6 is a perspective view of the underside of an inner susceptor portion according to some embodiments.

FIG. 6 illustrates a perspective view of the underside of the inner susceptor portion 102. In some embodiments, the inner susceptor portion 102 may have a diameter in the range of about 245 mm to 265 mm, about 250 mm to 260 mm, or about 257.46 mm to 257.62 mm in some embodiments, depending upon the size of the substrate to be processed on the susceptor 150 of which the inner susceptor portion 102 is a part. In some embodiments, the diameter of the inner susceptor portion 102 may be about 257.54 mm. The inner susceptor portion 102 may have a thickness in the range of about 4.5 mm to 6.5 mm, about 5 mm to 6 mm, or about 5.47 mm to 5.73 mm in some embodiments. In some embodiments, the thickness of the inner susceptor portion 102 may be about 5.6 mm.

In some embodiments, the inner susceptor portion 102 may have a shape in which the first disc 102*a*, and the second disc 102*b*, each having a different diameter, overlap each other concentrically when seen from the underside. As illustrated, the second disc 102*b* may extend completely across and beyond the second disc 102*a*. When the inner susceptor portion 102 and the outer susceptor portion 104 are integrated to form a single unit, the first disc 102*a* may fit into an opening of the top surface 104*c* of the outer susceptor portion and the second disc 102*b* may fit into an opening of the top surface 104*b* of the outer susceptor. The top surface 104*c* of the outer susceptor may support a perimeter of the second disc 102*b*. The first disc 102*a* may have a diameter in the range of about 200 mm to 250 mm, about 210 mm to 240 mm, about 220 mm to 230 mm, or about 225.12 mm to 225.28 mmin some embodiments. In some embodiments, the diameter of the first disc 102*a* may be about 225.20 mm. The second disc 102*b* may have a diameter in the range of about 220 mm to 270 mm, about 230 mm to 260 mm, about 240 mm to 250 mm, or about 244.11 mm to 244.37 mm in some embodiments. In some embodiments, the diameter of the second disc 102*b* may be about 244.24 mm.

The first disc 102*a* may have recessed seats 126 around the inner perimeter of the disc. The recessed seats 126 may take the form of circular indentations and may receive corresponding robot arms of a support spider 120, as described in relation to FIG. 8. The first disc 102*a* may have one or more, three or more, or six or more recessed seats 126. In some embodiments, the first disc 102*a* may have three recessed seats 126 on which the inner susceptor portion 102 may rest on the support spider 120. The first disc 102*a* may also have a cavity 125, 604 near the center of the inner susceptor portion 102 for receiving a thermocouple 606 (FIGS. 7A and 7B).

The underside of the inner susceptor portion 102 includes recesses 404. For example, the disc 102*a* may have the recesses 404. These recesses 404 are opposed and correspond to the tabs 402 of the outer susceptor portion 104 shown in FIG. 4A. The shape, number, and locations of the recesses 404 preferably correspond to the shape, number, and locations of the tabs 402. When the inner susceptor portion 102 is lowered onto the outer susceptor portion 104 the recesses 404 and the tabs 402 align and mate; the tabs 402 fit within the recesses 404. By having corresponding recesses 404 and tabs 402, the inner susceptor portion 102 is kept in a stationary position relative to the outer susceptor portion 104, which keeps a retained substrate from being damaged by relative movement of the inner and outer susceptor portions 102, 104 when a substrate is present on the inner susceptor portion 102.

Preferably, the edges of the recesses 404 are chamfered. In some embodiments, the edges are chamfered such that they provide a relatively large recess opening which progressively becomes smaller with increasing height.

With reference now to FIGS. 7A and 7B, a cross sectional sideview is illustrated of the inner susceptor portion 102. Enlarged views of the middle portion 602 of the inner susceptor portion 102 has been provided. The middle portion 602 may include a cavity 604 in the inner susceptor portion 102 within which a thermocouple 606 may be accommodated. It will be appreciated that the thermocouple 606 measures the temperature of the inner susceptor portion 102. While it has been expected that tight contact between the thermocouple 606 and the inner susceptor portion 102 would provide the most accurate temperature measurement, it has been found that limiting contact between the thermocouple 606 and inner susceptor portion 102 may improve the accuracy of temperature measurements. Without being limited by theory, it is believed that the thermocouple 606 may act as a heat sink and inadvertently transfer heat from the inner susceptor portion 102 while it measures the temperature of that inner susceptor portion 102. It has been found that positioning the thermocouple 606 such that the thermocouple 606 does not touch the walls of the middle portion 602 of the inner susceptor portion 102 provides a more accurate temperature reading by decreasing the amount of heat transferred from the interior of the inner susceptor portion 102. In some embodiments, the cavity 604 is larger than the tip of the thermocouple 606. For example, the cavity 604 may be wider than the width of the thermocouple 606. It will be appreciated that the cavity 604 may be analogous to the cavity 125 described in relation to FIG. 8.

In addition, it will be appreciated that both the inner susceptor portion 102 and the thermocouple 606 both thermally expand when heating and therefore the diameter of the cavity 604 may be adjusted to account for thermal expansion so that the sidewalls of the inner susceptor portion 102 do not touch the thermocouple 606. It has been found that materials typically used for thermocouples and susceptors have different coefficients of thermal expansion, with thermocouples typically expanding more than susceptors. In some embodiments, the cross-sectional area of the cavity 604 is preferably larger than the corresponding cross-sectional area of the thermocouple 606, such that a gap is maintained between the thermocouple 606 in the cavity 604 at the elevated temperature used for semiconductor processing (e.g., at temperatures of 200-1300° C., 200-1000° C., or 250-500° C.). In some embodiments, the gap between the thermocouple 606 and the walls of the cavity 604 may be maintained as an air gap, containing a gas (e.g., an inert gas), which may be under vacuum in some embodiments. In some other embodiments, the gap may be filled with suitable materials with low thermal conductivity. The thermocouple 606 may be generally cylindrical in shape with a domed tip on the end inserted into the cavity 604. The cavity 604 may be generally cylindrical with a flat end in the inner susceptor portion 102. As illustrated in FIG. 7A, in some embodiments, the air gap may extend around the sides and the top of the tip of the thermocouple 606, such that the thermocouple 606 does not contact the inner susceptor portion 102 at all. More preferably, and as illustrated in FIG. 7B, the upper part of a thermocouple 606 may contact the inner susceptor portion 102 to provide a measurement of the susceptor temperature near the upper surface of the susceptor in close proximity with a retained substrate, while providing only a low level of contact and thermal conduction between the inner susceptor portion 102 and thermocouple 606. Preferably, the thickness of the part of the inner susceptor portion 102 above the thermocouple 606 is sufficient to protect the thermocouple against direct infrared light (e.g., infrared light from heating lamps used to heat the processing chamber). In some embodiments, the thickness of the inner susceptor portion 102 above the thermocouple 606 is about 1 mm or more, about 1.2 mm more, or about 1.3 mm or more, including about 1.3 mm and including an upper limit of 1.5 mm in some embodiments. The total thickness of the inner susceptor portion 102 may be in the range of about 3 mm to 8 mm, about 4 mm to 7 mm, or about 5 mm to 6 mmin some embodiments. The depth of the cavity 604 may be in the range of about 2.3 mm to 7.7 mm, about 4.3 mm to 6.7 mm, or about 4.22 mm to 4.38 mm, in some embodiments. In some embodiments, the total thickness of the inner susceptor portion 102 may be about 5.6 mm, the cavity 604 may be about 4.3 mm deep, and the thickness of the inner susceptor portion 102 above the thermocouple 606 is about 1.3 mm.

It will be appreciated that the position of the upper part of the thermocouple 606 relative to the inner susceptor portion 102 may affect the accuracy of thermocouple temperature readings. In some embodiments, the thermocouple 606 may have direct contact with a top portion of the cavity 604, such that the thermocouple 606 can measure the temperature of the susceptor at the specific point of contact while maintaining a low level of heat conduction between the thermocouple 606 and the susceptor, thereby reducing temperature nonuniformities across the substrate that may be caused by the thermocouple 606. In some other embodiments, the thermocouple 606 may be surrounded by the air gap such that the thermocouple is not in contact the susceptor at all. In such embodiments, the thermocouple 606 may be placed within a certain distance from the susceptor such that the thermocouple 606 can still obtain accurate temperatures for the center of the susceptor. In embodiments with a fully-surrounding air gap, the ratio of the air gap between the thermocouple 606 and the top of the cavity 604 to the air gap between the side of the thermocouple to the wall of the cavity may be about 1:1 or lower, about 1:2 or lower, about 1:4 or lower, or about 1:8 or lower. It will be further appreciated that the size of the cavity 604 may be small enough to maintain an accurate thermal reading, while still preventing direct contact between the thermocouple 606 and at least the sides of the cavity 604. In some embodiments, the diameter of the cavity may be in the range of 3 mm to 8 mm, including 4 mm to 5 mm. In some embodiments, the diameter of the cavity may be 4.32 mm.

In some embodiments, the surface of the outer susceptor portion 104 may include grids, which may be formed by plateaus or islands of susceptor material separated by grooves. In some other embodiments, the surface of outer susceptor portion 104 may be smooth and omit grids. Preferably, the surface of the outer susceptor portion 104 is smooth to reduce risk of substrate damage due to contact with sharp grid groove edges.

Although this invention has been described in terms of certain embodiments, other embodiments that are apparent to those of ordinary skill in the art, including embodiments that do not provide all of the features and advantages set forth herein, are also within the scope of this invention. As will be appreciated by those with skill in the art that each of the individual variations described and illustrated herein has discrete components and features which may be readily separated from or combined with the features of any of the other several embodiments without departing from the scope or spirit of the present disclosure. For example, in some embodiments, a susceptor may have all of the various features disclosed herein (including the above-described ledge, pad, concavity, lobes, and thermocouple arrangement). In some embodiments, a susceptor may include only one or less than all of the above-describe features (e.g., only one or less than all of the above-described ledge, pad, concavity, lobes, and thermocouple arrangement). All such modifications are intended to be within the scope of claims associated with this disclosure.

What is claimed is:

1. A method for processing a substrate, the method comprising:

providing the substrate on a susceptor in a processing chamber, wherein the susceptor comprises an inner susceptor portion and an outer susceptor portion that encircles the inner susceptor portion, and wherein the inner susceptor portion includes a cavity defining a volume for accommodating a thermocouple, the cavity being formed through an underside of a middle portion of the inner susceptor portion, wherein the inner susceptor portion includes a plurality of recesses, and the outer susceptor portion includes a plurality of lobes extending under the inner susceptor portion to support the inner susceptor portion, and wherein each of the lobes has a generally triangular shape, which is defined by sloping sides which extend towards a rounded apex pointed towards the interior of the susceptor, and aligns within a corresponding one of the recesses, wherein the apex of the triangular shape of the lobes protrudes toward a center of the inner susceptor portion;

providing a thermocouple in the cavity, wherein the thermocouple is separated from walls of the cavity by an air gap; and processing the substrate on the susceptor in the processing chamber, wherein processing the substrate comprises heating the substrate and the susceptor, wherein the air gap is maintained during substrate processing.

2. The method of claim 1, wherein a tip of the thermocouple contacts an upper end of the cavity while processing the substrate.

3. The method of claim 1, wherein material forming the thermocouple has a higher coefficient of thermal expansion than material forming the susceptor.

4. The method of claim 1, wherein a thickness of the inner susceptor portion above the thermocouple is about 1 mm or more.

5. The method of claim 1, wherein the thickness is less than 1.5 mm.

6. The method of claim 1, wherein the walls of the cavity define a cylinder.

7. The method of claim 1, wherein an upper end of the cavity is flat.

8. The method of claim 1, wherein a tip of the thermocouple is hemispherical.

* * * * *